(12) United States Patent
Saha et al.

(10) Patent No.: US 6,476,613 B2
(45) Date of Patent: Nov. 5, 2002

(54) METHOD OF FAULT LOCATION IN PARALLEL TRANSMISSION LINES WITH SERIES COMPENSATION

(75) Inventors: Murari Mohan Saha, Västerås (SE); Jan Izykowski, Damrota; Eugeniusz Rosolowski, Wroclaw, both of (PL)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/902,863

(22) Filed: Jul. 10, 2001

(65) Prior Publication Data

US 2002/0118021 A1 Aug. 29, 2002

Related U.S. Application Data

(63) Continuation-in-part of application No. 09/745,161, filed on Dec. 20, 2000, now abandoned.

(51) Int. Cl.$^7$ .......................... G01R 31/02; G01N 27/42
(52) U.S. Cl. .................. 324/522; 324/523; 324/525; 324/527; 324/529; 702/59; 702/58
(58) Field of Search .................. 324/522, 527, 324/523, 525, 529; 702/59, 58

(56) References Cited

U.S. PATENT DOCUMENTS

| | | | |
|---|---|---|---|
| 4,107,778 A | | 8/1978 | Nii et al. ................ 702/59 |
| 4,128,805 A | * | 12/1978 | Lanz ..................... 324/727 |
| 4,313,169 A | | 1/1982 | Takagi et al. ............ 702/59 |
| 4,559,491 A | * | 12/1985 | Saha ..................... 324/522 |
| 4,719,580 A | * | 1/1988 | Nimmersjo ............... 702/59 |
| 4,785,249 A | * | 11/1988 | Yoshida .................. 324/509 |
| 4,797,805 A | * | 1/1989 | Nimmersjo ............... 702/59 |
| 4,906,937 A | * | 3/1990 | Wikstrom et al. ......... 324/522 |
| 5,072,403 A | * | 12/1991 | Johns .................... 702/59 |
| 5,455,776 A | * | 10/1995 | Novosel .................. 702/59 |
| 5,600,248 A | * | 2/1997 | Westrom ................. 324/522 |
| 5,659,453 A | * | 8/1997 | Russell et al. ........... 361/76 |
| 5,661,664 A | * | 8/1997 | Novosel et al. ........... 700/293 |
| 5,773,980 A | * | 6/1998 | Yang ..................... 324/525 |
| 5,825,189 A | * | 10/1998 | Johns .................... 324/525 |
| 5,839,093 A | * | 11/1998 | Novosel et al. ........... 702/59 |
| 5,990,686 A | * | 11/1999 | Vokey et al. ............. 324/523 |
| 6,262,578 B1 | * | 7/2001 | Hudson ................... 324/522 |

FOREIGN PATENT DOCUMENTS

| | | |
|---|---|---|
| WO | WO 99/32894 | 7/1999 |

OTHER PUBLICATIONS

Sandh, H., International-Type Search Report, Search Request No. SE 99/01738, Aug. 16, 2000, pp. 1–4.

* cited by examiner

Primary Examiner—N. Le
Assistant Examiner—Wasseem H. Hamdan
(74) Attorney, Agent, or Firm—Jenkens & Gilchrist, A Professional Corporation

(57) ABSTRACT

The present invention relates to a method for locating a fault (F) in a section of parallel transmission lines in a network comprising the steps: measuring the currents and voltages of both lines at a measuring point arranged at one end (A) of the section, determining the fault distance (x) between the measuring point and the fault as a solution of an equation $Ax^2-Bx+C-R_f=0$ comprising the fault distance (x) as a variable and the fault resistance ($R_f$), the invention is characterised in that the parameters (A, B, C, D) comprise the phase components of the locally measured currents and voltages and are obtained from calculating from the measuring point to the fault location along the both parallel lines, and wherein the equation is resolved into its real and imaginary parts:

Real$(A)x^2$−Real$(B)x$+Real$(C)$−$R_f$=0

Imag$(A)x^2$−Imag$(B)x$+Imag$(C)$=0, whereby the fault distance is derived from the imaginary part.

18 Claims, 7 Drawing Sheets

METHOD OF FAULT LOCATION IN PARALLEL TRANSMISSION LINES WITH SERIES COMPENSATION

RELATED APPLICATIONS

This is a continuation-in-part application of U.S. Ser. No. 09/745,161, filed on Dec. 20, 2000, now abandoned.

TECHNICAL FIELD

The present invention relates to an improved method for locating a fault (F) in a section of parallel transmission lines in a network by using symmetrical components.

BACKGROUND OF THE INVENTION

Parallel series-compensated lines, i.e., lines provided with series capacitors and metal oxide varistors for improving the power transfer and enhancing power and voltage control of long transmission lines, are very important links between power generation and energy consumption regions. However, installation of series capacitors and varistors causes certain problems for fault location.

Accurate fault location in parallel power transmission lines with series compensation requires compensating for the following effects:

1. the remote infeed effect under resistive faults,
2. the effect of the mutual coupling between the lines for the zero sequence (—"zero sequence" relates to symmetrical components in 3 phase A.C power transmission),
3. the effect of series compensation.

The countermeasures for the first two effects (1 and 2 as listed above) are applied for example in the single-ended fault locator proposed in U.S. Pat. No. 4,559,491. However, this fault locator is designated to locating faults in uncompensated lines, i.e., lines without series capacitor compensation. The cited method utilizes local measurements (phase voltages, post-fault and pre-fault phase currents from the faulted line and a zero sequence current from the healthy line) as well as the impedance parameters for the lines and for the equivalent supplying systems at both the line ends. As the remote system impedance is not measurable with the single ended method, the fault locator according to U.S. Pat. No. 4,559,491 uses an algorithm applying the representative value of this impedance for the positive sequence (—the term "positive sequence", and "negative sequence" relate to symmetrical components in three phase A.C. transmission).

This is possible due to comparatively high robustness of this algorithm against mismatch of the actual and the representative values. However, in extreme cases of the high mismatch there is an additional source of error of the location algorithm. Moreover, the source impedances are also subjected to changes under evolving faults. In addition, if there is an extra link between the stations, the impedance of this equivalent link ought to be provided for the location algorithm, and obviously inaccuracy in this data affects the fault location too.

A countermeasure for the effect under point 3 above (the effect of series compensation) has been proposed in international patent application PCT/SE98/02404, where the idea from U.S. Pat. No. 4,559,491, as well as in Article "A new fault locating algorithm for series compensated lines", IEEE Trensactions on Power Delivery, Vol. 14, No. 3, July 1999, pp 789–795, is extended to the case of locating faults in a single line with series compensation. For this purpose the fundamental frequency equivalenting of parallel branches of a compensating series capacitor (SC) and a Metal Oxide Varistor (MOV) has been introduced. Currents flowing through MOVs in particular phases during unsymmetrical faults have different amplitudes. As a consequence of that the parameters (resistances and reactances) of the fundamental frequency equivalents are different in particular phases. So, MOVs in particular phases may have different fundamental frequency representations in the fault location algorithm.

SUMMARY OF THE INVENTION

The object of the present invention is to provide a fault location method which does not require the knowledge of the source impedances of the system behind both stations and takes into consideration the reactance effect, the series compensation effect and the mutual coupling between the lines. The inventive fault location method generally comprises steps of measuring the currents and voltages of both lines at a measuring point arranged at one end (A) of the section, determining the fault distance (x) between the measuring point and the fault as a solution of an equation comprising the fault distance as a variable and the fault resistance.

The invention in its broad form resides in method for automatically locating a fault (F) in a section of parallel A.C. transmission lines in a network comprising the steps of:

measuring currents and voltages of both lines at a measuring point arranged at one end (A) of the section, determining a fault distance (x) between the measuring point and the fault as a solution of an equation comprising the fault distance (x) as a variable and the fault resistance ($R_f$), wherein the equation is $$Ax^2 - Bx + C - R_f D = 0$$

wherein parameters A, B, C, D comprise phase components of the locally measured currents and voltages and are obtained by calculating from the measuring point to the fault location along both the parallel lines, and wherein the equation is resolved into its real and imaginary parts.

The method according to the present invention displays advantages in relation to the above mentioned prior art methods. It is suited for fault location in parallel lines with series compensation as well as after adequate setting for fault location in parallel uncompensated lines. It is based on phase coordinates approach which allows the incorporation of the fundamental frequency equivalents of the SCs&MOVs and to locate faults in the untransposed parallel lines. Further, it utilizes the local post-fault measurements, i.e., for the fault locator from the station A;—the phase voltages,—the phase currents from the faulted line and—the phase currents from the healthy line. It requires knowing the impedance parameters only for the lines (in terms of the self and mutual impedances of lines as well as for the mutual coupling between lines). Due to the utilization of the healthy line path, the impedances of the equivalent systems behind both the stations and the impedance of the equivalent link between the stations are not needed.

For determining the fault distance for series compensated lines, two subroutines are used: subroutine 1—estimating the distance to fault under assumption that it occurs behind the SCs&MOVs, and subroutine 2—estimating the distance to fault under assumption that it is applied in front of the SCs&MOVs. It is to be noted that usage of the algorithm for locating faults in parallel uncompensated lines relies on using only one of the subprocedures in which the fundamental frequency equivalents of the SCs&MOVs are set to zero for both the resistance and reactance parameters.

The sought fault distance is obtained with an extra selection procedure selecting the final result from the results of the both subroutines; the selection procedure yields the indication as to which subroutine is valid in a particular case on the base of information obtained:

a) the estimated fault resistances by both the subroutines,
b) amplitudes of the estimated currents of the healthy phases in the fault paths (for all the fault types except the three phase faults for which the selection procedure is performed only by (a)).

Thus, the present invention extends uncompensated lines fault locator to the case of parallel lines with series compensation, and extends the single series compensated line fault locator to the case of parallel series compensated lines. The main advantages of the present invention are that it does not require the knowledge of the source impedances of the systems behind both the stations and the impedance of the equivalent link between the stations. Moreover, it does not use the pre-fault measurements.

The introduced phase coordinates approach makes possible to incorporate the fundamental frequency equivalents into the model as well as to consider a line as an untransposed line.

These and other aspects of, and advantages with the present invention, will become apparent form the detailed description of an embodiment and from the accompanying drawings.

BRIEF DESCRIPTION OF THE DRAWINGS

In the detailed description reference will be made to the drawings, of which.

DETAILED DESCRIPTION OF THE INVENTION

Figure 1:
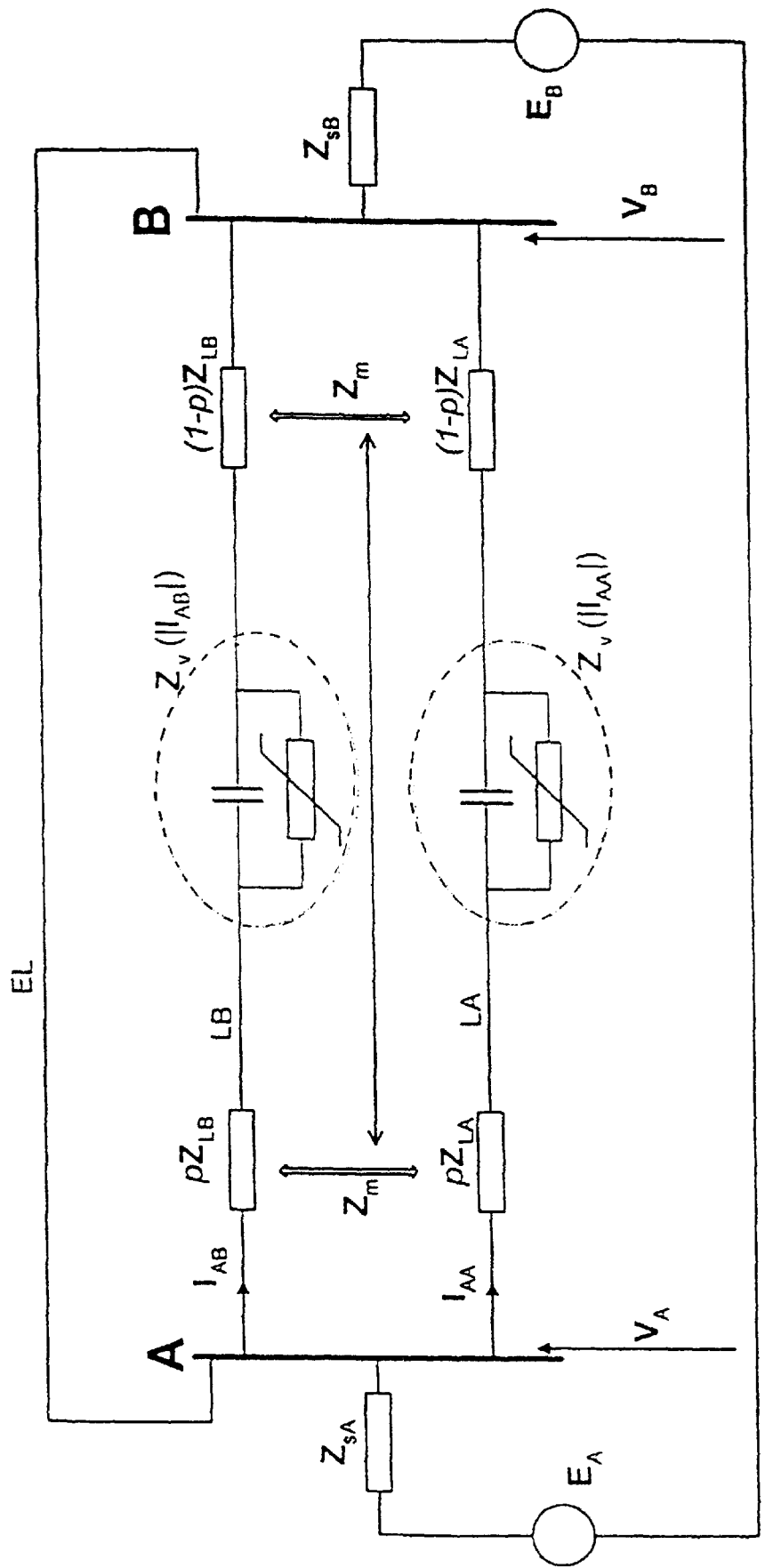
FIG. 1 is a schematic arrangement of series compensated parallel transmission lines.

A model of the system for introducing the phase coordinates approach is presented in FIG. 1. it is to be noted that in this figure and in this entire document, the matrix and vector quantities are intended to be bold-typed.

All the quantities (voltages, currents) are represented further as vectors. For example, the side A phase voltages are represented by the vector:

$$V_A = \begin{bmatrix} \underline{V}_{AR} \\ \underline{V}_{AS} \\ \underline{V}_{AT} \end{bmatrix} \quad (1)$$

Impedance parameters are expressed in the matrix form. For example, the matrix of the impedance for a line takes the form:

$$Z_L = \begin{bmatrix} \underline{Z}_{RR} & \underline{Z}_{RS} & \underline{Z}_{RT} \\ \underline{Z}_{SR} & \underline{Z}_{SS} & \underline{Z}_{ST} \\ \underline{Z}_{TR} & \underline{Z}_{TS} & \underline{Z}_{TT} \end{bmatrix} \quad (2)$$

Self and mutual impedances from equation (2) representing completely symmetrical 3-phase line, are defined by the positive ($\underline{Z}_{L1}$) and zero the ($\underline{Z}_{L0}$) sequence impedances of a line as:

$$\underline{Z}_{RR} = \underline{Z}_{SS} = \underline{Z}_{TT} = \frac{\underline{Z}_{L0} + \underline{Z}_{L1}}{3} \quad (3)$$

$$\underline{Z}_{RS} = \underline{Z}_{RT} = \underline{Z}_{SR} = \underline{Z}_{ST} = \underline{Z}_{TR} = \underline{Z}_{TS} = \frac{\underline{Z}_{L0} - \underline{Z}_{L1}}{3} \quad (4)$$

Figure 2A:
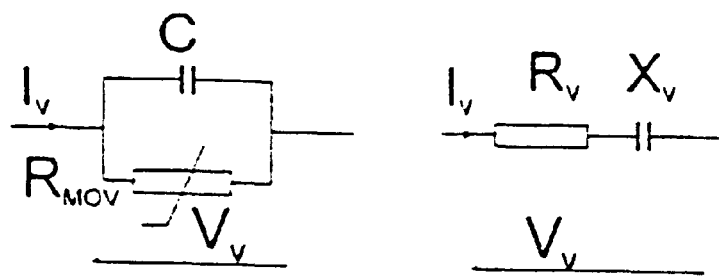
FIG. 2a is a scheme of fundamental frequency equivalence of the series capacitors and metal-oxide varistors.

The SC&MOV circuit in each phase of a line is linearized for the steady-state conditions and represented in the form of a fundamental frequency equivalent series $R_v$–$X_v$ connection (FIG. 2a).

The matrix of equivalent parameters for the SCs&MOVs from the line A (the current $I_{AA}$) is given as:

$$Z_v(|I_{AA}|) = \begin{bmatrix} Z_v(|I_{AA\_R}|) & 0 & 0 \\ 0 & Z_v(|I_{AA\_S}|) & 0 \\ 0 & 0 & Z_v(|I_{AA\_T}|) \end{bmatrix} \quad (5)$$

Figure 2B:
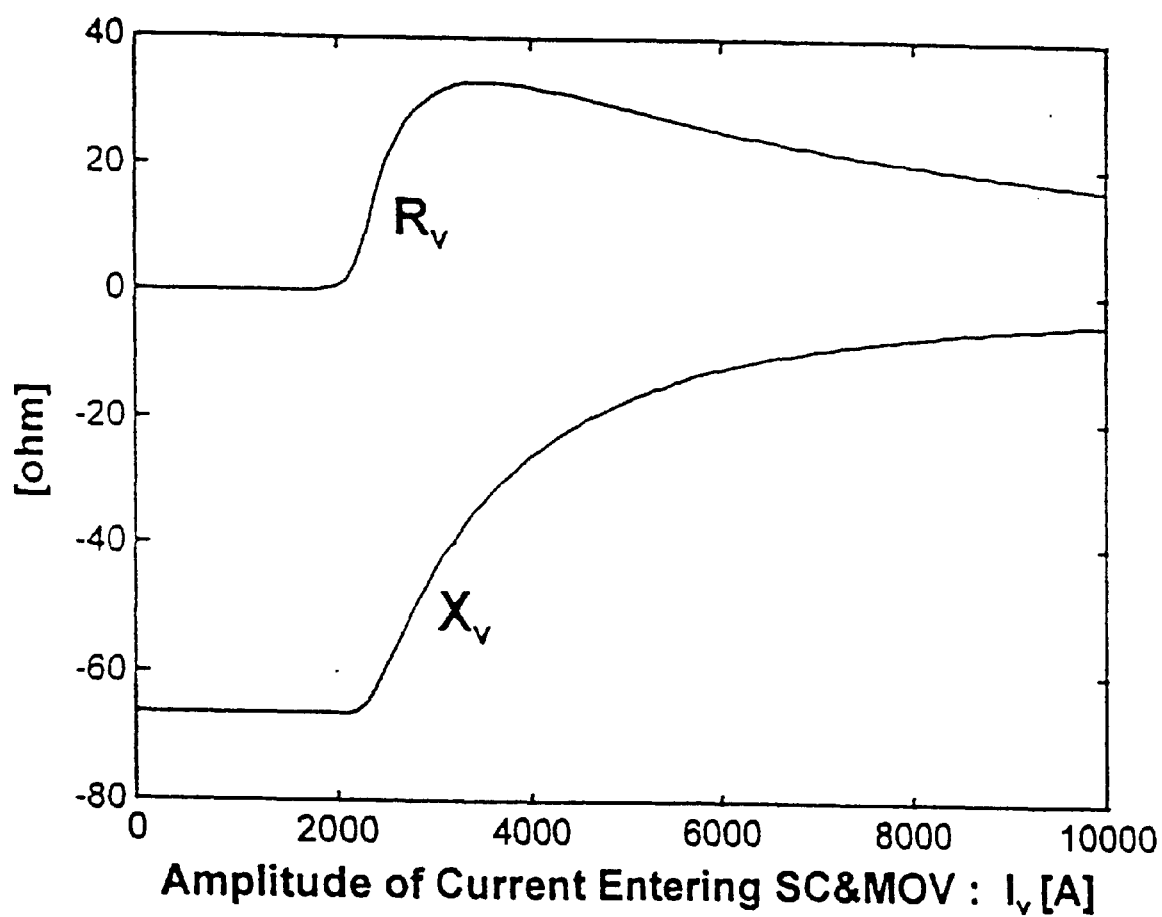
FIG. 2b shows a graph of the equivalent series resistance and reactance as a function of the amplitude of a current through the scheme of FIG. 2a, FIG. 3 is a schematic arrangement for representing different types of faults.

Diagonal elements of the matrix $Z_v$ depend on magnitudes of phase currents. Their real (resistance: $R_v$) and imaginary (reactance: $X_v$) components are obtained from the relations graphically shown in FIG. 2b.

Figure 3:
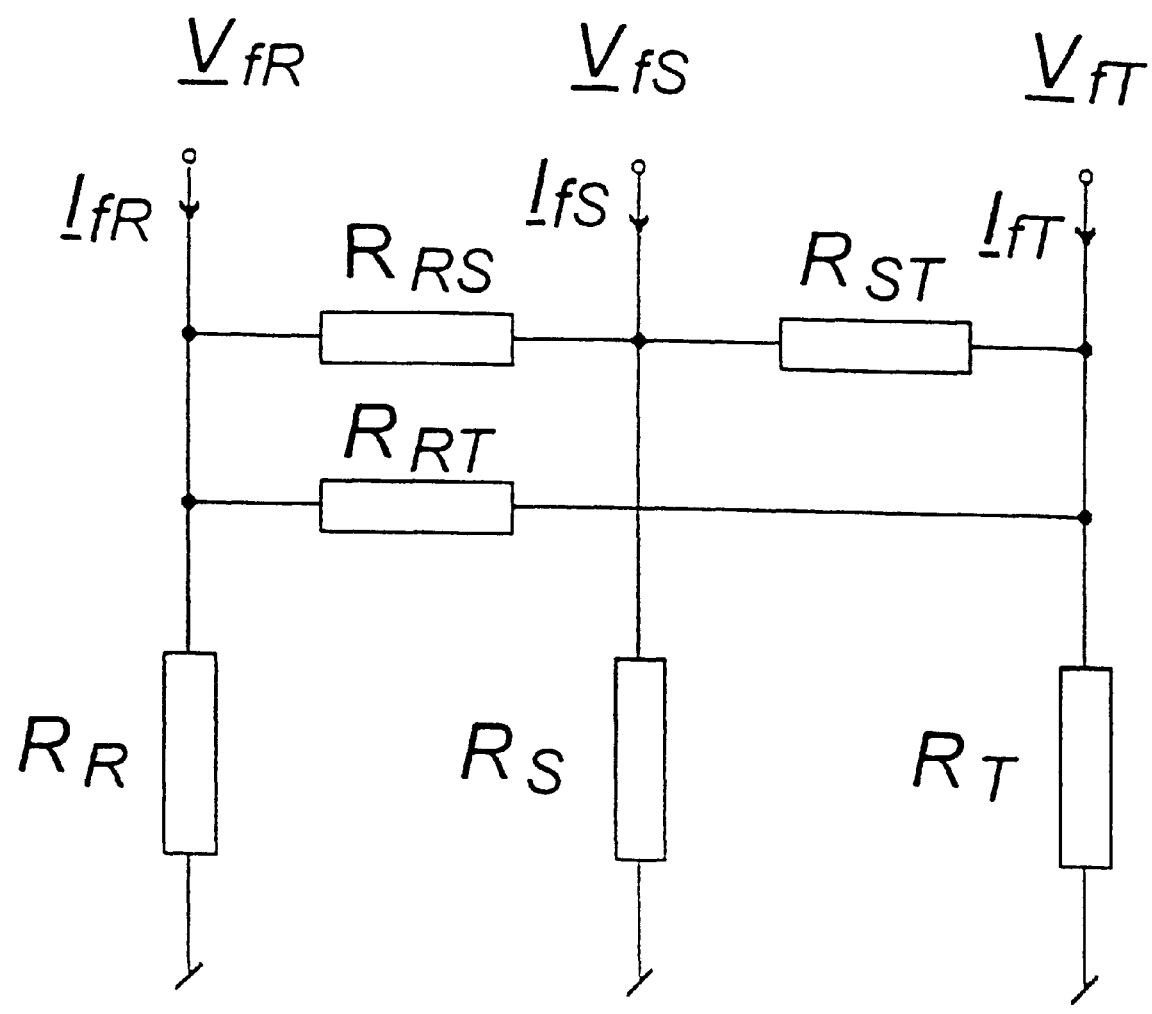

Faults in the considered system are described using the 3-phase general fault model (FIG. 3), which is representing a general fault situation. For this scheme one gets:

$$G_f V_f = I_f \quad (6)$$

where:

$$G_f = \begin{bmatrix} G_{RR} & -G_{RS} & -G_{RT} \\ -G_{RS} & G_{SS} & -G_{ST} \\ -G_{RT} & -G_{ST} & G_{TT} \end{bmatrix}$$

$$G_{RR} = \frac{1}{R_R} + \frac{1}{R_{RS}} + \frac{1}{R_{RT}}$$

$$G_{RS} = \frac{1}{R_{RS}} \qquad G_{RT} = \frac{1}{R_{RT}}$$

$$V_f = \begin{bmatrix} \underline{V}_{fR} \\ \underline{V}_{fS} \\ \underline{V}_{fT} \end{bmatrix}$$

$$I_f = \begin{bmatrix} I_{fR} \\ I_{fS} \\ I_{fT} \end{bmatrix}$$

Assuming all the resistances in the fault circuit to be the same, say $R_f$, matrix $G_f$ takes the following form:

$$G_f = \frac{1}{R_f} K_f \quad (7)$$

$$K_f = \begin{matrix} k_{RR} & k_{RS} & k_{RT} \\ k_{RS} & k_{SS} & k_{ST} \\ k_{RT} & k_{ST} & k_{TT} \end{matrix}$$

The elements in matrix $K_f$ are determined in dependence on the type of fault as follows:
  non-diagonal elements are given the value 0 if the phase in question is not concerned by the relevant fault and the value −1 if the phase is concerned by the relevant fault
  the diagonal elements are given the value 1 if the phase in question has a fault to ground as the fault in question and to this added the sum of the absolute values of the non-diagonal elements in the relevant line.

A few examples of a filled-in matrix $K_f$ for some typical types of fault are shown below.

$$K_f = \begin{bmatrix} 1 & 0 & 0 \\ 0 & 0 & 0 \\ 0 & 0 & 0 \end{bmatrix} \text{ for fault to ground}$$

$$K_f = \begin{bmatrix} 1 & -1 & 0 \\ -1 & 1 & 0 \\ 0 & 0 & 0 \end{bmatrix} \text{ for fault R-S}$$

$$K_f = \begin{bmatrix} 3 & -1 & -1 \\ -1 & 3 & -1 \\ -1 & -1 & 3 \end{bmatrix} \text{ for fault R-S-T-G}$$

$$K_f = \begin{bmatrix} 2 & -1 & 0 \\ -1 & 2 & 0 \\ 0 & 0 & 0 \end{bmatrix} \text{ for fault R-S-G}$$

$$K_f = \begin{bmatrix} 2 & -1 & -1 \\ -1 & 2 & -1 \\ -1 & -1 & 2 \end{bmatrix} \text{ for fault R-S-T}$$

Fault Location Algorithm

Figure 4:
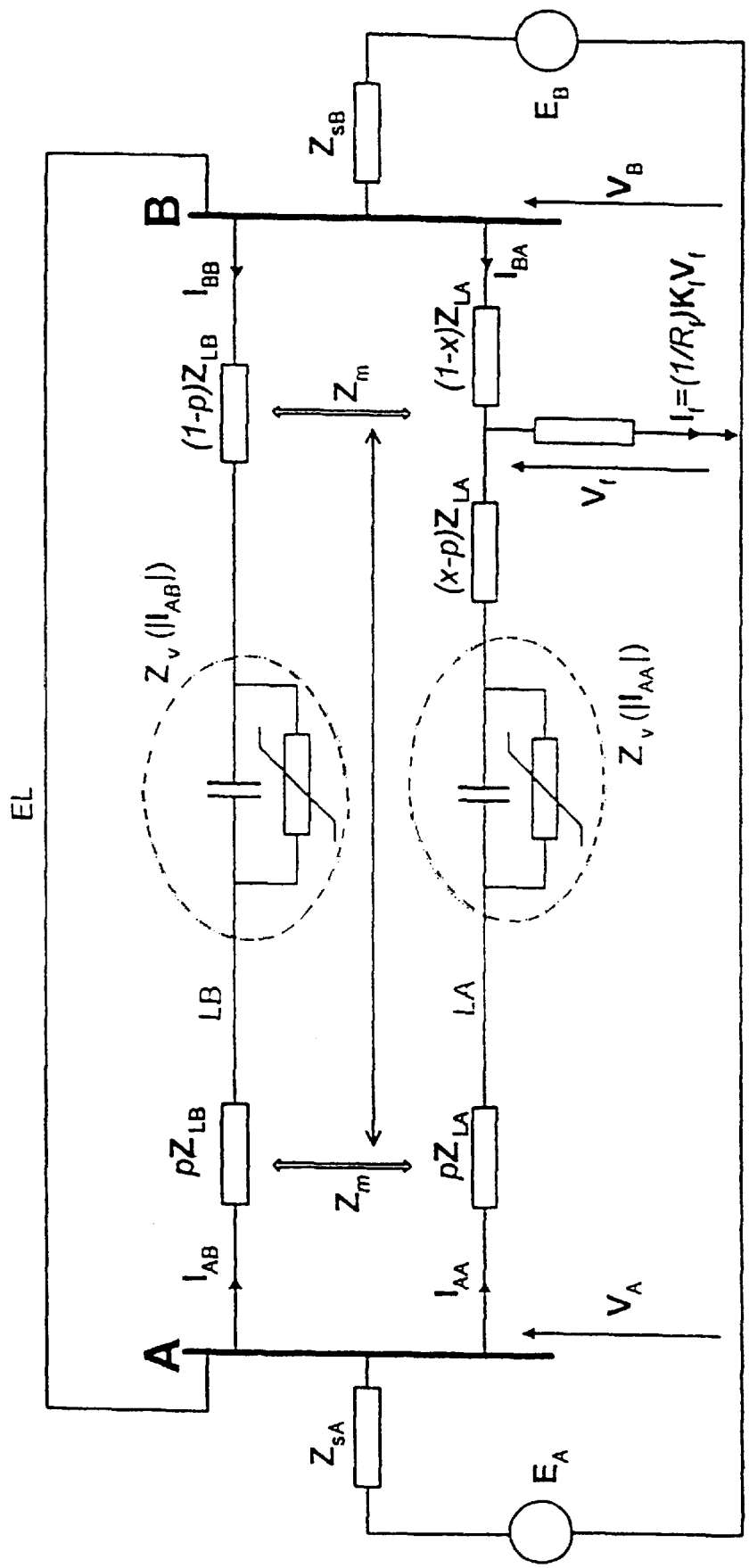
FIG. 4 is a model of the system for faults located behind the series compensation as seen from the measuring point.
Figure 5:
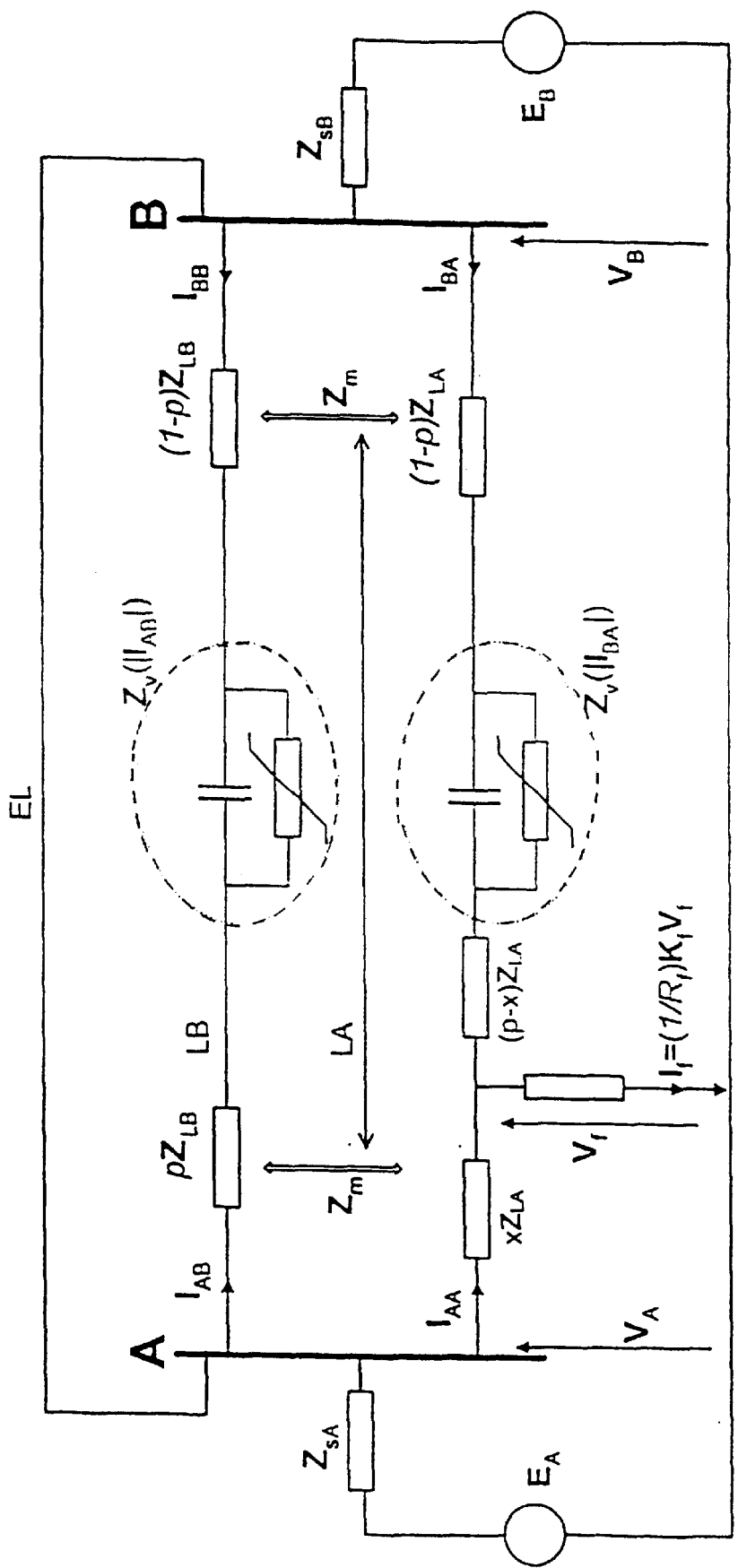
FIG. 5 is the model according to FIG. 4 where the fault is located in front of the series compensation.

Below, a fault location algorithm is derived assuming that fault location process is performed with use of the post-fault quantities from the station A and for the faulted line A (FIGS. 4,5).

There are two distinctive fault locations considered by the fault location algorithm with the subroutines considering:
  faults behind the SCs&MOVs (Subroutine 1)
  faults in front of the SCs&MOVs (Subroutine 2)

Fault location algorithm—the subroutine for the case of a fault behind SCs&MOVs (SUBROUTINE 1).

FIG. 4 shows the series compensated network for the case of faults occurring behind the SCs&MOVs, but not overreaching the total line length. In this case a fault loop as seen from the station A contains the SCs&MOVs and the infeed is via the remote segment of the faulted line. In addition, mutual coupling between the healthy and the faulted lines has to be taken into account.

Using matrix notation, the model of the series-compensated network from FIG. 4 can be expressed as:

$$V_f = V_A - xZ_{LA}I_{AA} - Z_v(|I_{AA}|)I_{AA} - xZ_m I_{AB} \quad (8a)$$

or:

$$V_f = V_B - (l-x)Z_{LA}I_{BA} + (l-x)Z_m I_{AB} \quad (8b)$$

by utilizing:

$$I_{BB} = -I_{AB}$$

where:
  x—unknown and the sought distance to a fault, counted from the station A to the fault place $(p \leq x \leq 1)$, $Z_{LA}$—impedance matrix for the faulted line,
  $Z_v(|I_{AA}|)$—three-phase fundamental frequency equivalent of the SCs&MOVs from the faulted line,
  $Z_m$—impedance matrix for the mutual coupling between the lines.

It is to be noted that for the healthy line, equation (8b), it is assumed that phase currents at both the line ends are equal to each other (this is a consequence of neglecting shunt capacitances).

On the other hand, the voltage drop between the stations A and B can be calculated by considering the path of the healthy line:

$$V_A - V_B = (Z_{LB} + Z_v(|I_{AB}|))I_{AB} + xZ_m I_{AA}(l-x)Z_m I_{BA} \quad (8c)$$

where:
  $Z_{LB}$—impedance matrix for the healthy line (basically equal to the impedance matrix of the faulty line $Z_{LA}$,
  $Z_v(|I_{AB}|)$—three-phase fundamental frequency equivalent of the SCs&MOVs from the healthy line.

Subtracting equation (8a) and equation (8b) gives $$0 = (V_A - V_B) - xZ_{LA}I_{AA} - Z_v(|I_{AA}|)I_{AA} + Z_{LA}I_{BA} - xZ_{LA}I_{BA} - Z_m I_{AB} \quad (9)$$

Substituting equation (8c) into equation (9) and rearranging gives three-phase currents flowing in the faulted line in the remote station B:

$$I_{BA} = \frac{A_0 + B_0 I_{AA}}{B_0(l-x)} \quad (10)$$

where:

$$A_0 = (Z_{LB} + Z_v(|I_{AB}|) - Z_m)I_{AB} - Z_v(|I_{AA}|)I_{AA}$$

$$B_v = Z_m - Z_{LA}$$

Voltages at a fault point (FIG. 4) can be expressed as in equation (8a):

$$V_f = V_A - xZ_{LA}I_{AA} - Z_v(|I_{AA}|)I_{AA} - xZ_m I_{AB} \quad (11)$$

If shunt capacitances of the line are neglected, which has been assumed here, the currents in the fault paths (FIG. 4) are expressed by a sum of the phase currents from both the stations:

$$I_f = I_{AA} + I_{BA} \quad (12)$$

Substituting equation (11) and equation (12) into equation (6) gives:

$$G_f(V_A-(xZ_{LA}+Z_v(|I_{AA}|))I_{AA}-xZ_mI_{AB})=I_{AA}+I_{BA} \quad (13)$$

Substituting remote station phase currents $I_{BA}$ equation (10) into equation (13) and taking also equation (7), after performing multiplications and further rearranging, the following matrix formula (second order equation with respect to the sought distance to a fault, x) is obtained:

$$A_c x^2 - B_c x + C_c - D_c = 0 \quad (14)$$

where:

$A_c, B_c, C_c, D_c$—3*1 vectors:

$A_c=(Z_m-Z_{LA})K_f(Z_{LA}I_{AA}+Z_mI_{AB})$ $C_c=(Z_m-Z_{LA})K_f(V_A-Z_v(|I_{AA}|)I_{AA})$ $B_c=A_c+C_c$ $D=(Z_m-Z_{LA}-Z_v(|I_{AA}|))I_{AA}-(Z_m-Z_{LB}-Z_v(|I_{AB}|))I_{AB}$ $D_c=DR_f$ where:

$R_f$—equivalent fault resistance equation (7).

Equation (14) represents a matrix formula for the sought distance to a fault, x, and the unknown equivalent fault resistance $R_f$. Multiplying both the sides of equation (14) by the vector:

$$P = \frac{D}{D^T D} \quad (15)$$

where:

$D^T$—matrix transposed with respect to the matrix D, one obtains the following resultant complex scalar equation:

$$Ax^2 - Bx + C - R_f = 0 \quad (16)$$

where:

$A=PA_c$ $B=PB_c$ $C=PC_c$ $P=D^T/(D^T D)$ $D^T$—matrix transposed with respect to D, The scalar quadratic equation (16) can be resolved into its real and imaginary parts:

$$\text{Real}(A)x^2 - \text{Real}(B)x + \text{Real}(C) - R_f = 0 \quad (17)$$

$$\text{Imag}(A)x^2 - \text{Imag}(B)x + \text{Imag}(C) = 0 \quad (18)$$

The imaginary part, equation (18), does not contain $R_f$. Solving it, one obtains the sought distance to a fault, $x_1$, according to the SUBROUTINE 1, as:

$$x_1 = x_a, \text{ if Imag}(A) > 0, \quad (19)$$

$$x_1 = x_b, \text{ if Imag}(A) < 0,$$

where:

$$x_a = \frac{\text{Imag}(B) - \sqrt{D}}{2\text{Imag}(A)}$$

$$x_b = \frac{\text{Imag}(B) + \sqrt{D}}{2\text{Imag}(A)}$$

$\Delta = [\text{Imag}(B)]^2 - 4\text{Imag}(A)\text{Imag}(C)$

Knowing the distance to a fault, equation (19), ($x_1=x_a$ or $x_1=x_b$) one can determine the value of the equivalent fault resistance ($R_f$) from equation (17) as:

$$R_f = \text{Real}(A)x_1^2 - \text{Real}(B)x_1 + \text{Real}(C) \quad (20)$$

Fault location algorithm—the subroutine for the case of a fault in front of SCs&MOVs (SUBROUTINE 2)

FIG. 5 presents the series compensated network for the case of faults occurring in front of the SCs&MOVs. In this case a fault loop, as seen from the station A, does not contain the SCs&MOVs. The infeed is via the remote segment of the faulted line together with the SCs&MOVs. It is to be noted that the SCs&MOVs are not even present in the fault loops which are considered by the fault location algorithm and influence the fault location. This is so, because the SC&MOVs influence the remote infeed. Therefore, the SCs&MOVs have to be taken into account when deriving the fault location subroutine of this case too.

As in the previous subroutine, using matrix notation, one can write the following equation for the faulted network of FIG. 5:

$$V_f = V_A - xZ_{LA}I_{AA} - xZ_mI_{AB} \quad (22a)$$

or:

$$V_f = V_B - (l-x)Z_{LA}I_{BA} + (l-x)Z_mI_{AB} - Z_v(|I_{BA}|)I_{BA} \quad (22b)$$

where:

x—unknown and the sought distance to a fault, counted from the station A to the fault place ($0 \leq x \leq p$), $Z_{LA}$—impedance matrix for the faulted line, $Z_v(|I_{BA}|)$—three-phase fundamental frequency equivalent of the SCs&MOVs from the faulted line, $Z_m$—impedance matrix for the mutual coupling between the lines.

It is to be noted that for the healthy line it is assumed that phase currents at both the line ends are equal to each other (this is a consequence of neglecting shunt capacitances).

On the other hand, the voltage drop between the stations A and B can be calculated by considering the path of the healthy line:

$$V_A - V_B = Z_{LB} + Z_v(|I_{AB}|)I_{AB} + xZ_mI_{AA} - (l-x)Z_mI_{AA} - (l-x)Z_mI_{BA} \quad (23)$$

where:

$Z_{LB}$—impedance matrix for the healthy line, $Z_v(|I_{AB}|)$—three-phase fundamental frequency equivalent of the SCs&MOVs from the healthy line.

Three-phase currents flowing in the faulted line at the remote station B can be determined from equations (22) and (23) as:

$$I_{BA} = \frac{C_0 + xB_0 I_{AA}}{(B_0 - Z_v(|I_{BA}|)) - xB_0} \quad (24)$$

where:

$C_0 = (Z_{LB} + Z_v(|I_{AB}|) - Z_m)I_{AB}$ $B_0 = Z_m - Z_{LA}$

Voltages at a fault point (FIG. 5) can be expressed as in equation (22a):

$$V_f = V_A - xZ_{LA}I_{AA} - xZ_m I_{AB} \quad (25)$$

If shunt capacitances of the line are neglected (which has been assumed here) currents in the fault paths (FIG. 5) are expressed by a sum of the phase currents from both the stations:

$$I_f = I_{AA} + I_{BA} \quad (26)$$

Substituting equation (25) and equation (26) into equation (6) gives:

$$G_f(V_A - (xZ_{LA} + Z_v(|I_{AA}|))I_{AA} - xZ_m I_{AB}) = I_{AA} + I_{BA} \quad (27)$$

Substituting the remote station phase currents $I_{AB}$ in equation (24) into equation (27) and taking also equation (7) after performing multiplications and further rearranging, the following matrix formula (second order equation with respect to the sought distance to fault, x) is obtained:

$$A_c x^2 - B_c x + C_c - D_c = 0 \quad (28)$$

where:

$A_c, B_c, C_c, D_c$—3*1 vectors:

$A_c = (Z_m - Z_{LA})K_f(Z_{LA}I_{AA} + Z_m I_{AB})$ $B_c = (Z_m - Z_{LA})K_f(V_A + Z_{LA}I_{AA} + Z_m I_{AB}) - Z_v(|I_{BA}|)K_f(Z_{LA}I_{AA} + Z_{mAB})$ $C_c = (Z_m - Z_{LA} - Z_v(|I_{BA}|))K_f V_A$ $D = (Z_m - Z_{LA} - Z_v(|I_{BA}|))I_{AA} - (Z_m - Z_{LB} - Z_v(|I_{AB}|))I_{AB}$ $D_c = DR_f$ where:

$R_f$—equivalent fault resistance equation (7).

Equation (28) represents a matrix formula for the sought distance to a fault, x, and the unknown equivalent fault resistance $R_f$. Multiplying both the sides of equation (28) by the vector:

$$P = \frac{D}{D^T D} \quad (29)$$

where:

$D^T$—matrix transposed with respect to the matrix D, one obtains the following resultant complex scalar equation:

$$Ax^2 - Bx + C - R_f = 0 \quad (30)$$

where:

$A = PA_c$ $B = PB_c$ $C = PC_c$ $$P = \frac{D}{D^T D}$$

The scalar quadratic equation (30) can be resolved into its real and imaginary parts:

$$\text{Real}(A)x^2 - \text{Real}(B)x + \text{Real}(C) - R_f = 0 \quad (31)$$

$$\text{Imag}(A)x^2 - \text{Imag}(B)x + \text{Imag}(C) = 0 \quad (32)$$

The imaginary part, equation (32), does not contain ($R_f$): Solving it, one obtains the sought distance to a fault, $x_2$, according to the SUBROUTINE 2, as:

$$x_2 = x_a, \text{ if Imag}(A) > 0, \quad (33)$$

$x_2 = x_b$, if Imag(A)<0, where:

$$x_a = \frac{\text{Imag}(B) - \sqrt{D}}{2\text{Imag}(A)}$$

$$x_b = \frac{\text{Imag}(B) + \sqrt{D}}{2\text{Imag}(A)}$$

$\Delta = [\text{Imag}(B)]^2 - 4\text{Imag}(A)\text{Imag}(C)$

Knowing the distance to a fault, equation (33), ($x_2 = x_a$ or $x_2 = x_b$) one can determine the equivalent fault resistance ($R_f$) from equation (31) as:

$$R_f = \text{Real}(A)x_1^2 - \text{Real}(B)x_1 + \text{Real}(C) \quad (34)$$

Iterative calculation of the remote phase currents for the subroutine assuming a fault in front of the SCs&MOVs (Subroutine 2).

Solution of the resultant quadratic scalar equation (33) (for the SUBROUTINE 2 a fault assumed as occurring in front of the SCs&MOVs) requires knowing fundamental frequency three-phase equivalents of the SCs&MOVs. In case of the faulted line the amplitudes of the remote currents have to be known. This can be be achieved by means:

amplitudes of the remote phase currents are iteratively estimated (see next section), amplitudes of the remote phase currents are sent via communication channel (note: there is no need for synchronization of the data collection at both the ends).

Iterative Algorithm for Estimation of the Amplitudes of the Remote Currents

Determination of the amplitudes of the remote currents can be performed with the iterative algorithm for solution of the following set of nonlinear equations (note: numbering of equations is kept as in the section 3.2 where the SUBROUTINE 2 is derived):

Equation for the remote currents $$I_{BA} = \frac{C_0 + xB_0 I_{AA}}{(B_0 - Z_v(|I_{BA}|)) - xB_0} \quad (24)$$

where:

$C_0 = (Z_{LB} + Z_v(|I_{AB}|) - Z_m)I_{AB}$ $B_0 = Z_m - Z_{LA}$

Equation for the distance to a fault:

$$\text{Imag}(A)x^2 - \text{Imag}(B)x + \text{Imag}(C) = 0 \tag{32}$$

The sought distance to a fault, $x_2$, according to the SUBROUTINE 2, as:

$$x_2 = x_a, \text{ if } \text{Imag}(A) > 0, \tag{33}$$

$$x_2 = x_b, \text{ if } \text{Imag}(A) < 0,$$

where:

$$x_a = \frac{\text{Imag}(B) - \sqrt{\Delta}}{2\text{Imag}(A)}$$

$$x_b = \frac{\text{Imag}(B) + \sqrt{\Delta}}{2\text{Imag}(A)}$$

$$\Delta = [\text{Imag}(B)]^2 - 4\text{Imag}(A)\text{Imag}(C)$$

$A = PA_c$
$B = PB_c$
$C = PC_c$ $P = D^T/(D^T D)$ (vector)

$D^T$—matrix transposed with respect to D, where:

$A_c, B_c, C_c, D_c$-3*1 vectors:

$A_c = (Z_m - Z_{LA})K_f(Z_{LA}I_{AA} + Z_m I_{AB})$ $B_c = (Z_m - Z_{LA})K_f(V_A + Z_{LA}I_{AA} + Z_m I_{AB}) - Z_v(|I_{BA}|)K_f(Z_{LA}I_{AA} + Z_m I_{AB})$ $C_c = (Z_m - Z_{LA} - Z_v(|I_{BA}|))K_f V_A$ $D = (Z_m - Z_{LA} - Z_v(|I_{BA}|))I_{AA} - (Z_m - Z_{LB} - Z_v(|I_{AB}|))I_{AB}$

Equation determining the fundamental frequency equivalent of the SCs&MOVs:

$$Z_v(|I_{BA}|) = \begin{bmatrix} Z_v(|I_{BA\_R}|) & 0 & 0 \\ 0 & Z_v(|I_{BA\_S}|) & 0 \\ 0 & 0 & Z_v(|I_{BA\_T}|) \end{bmatrix} \tag{35}$$

Determining the distance to the fault is based in an iterative process before the iteration begins, the impedance of the series compensation of the faulty line is set and the initial value of IBA is calculated.

During the iteration process the coefficients A, B and C of the equation for fault distance calculation $Ax^2 - Bx + C - R_f = 0$ are calculated and subsequently the distance to fault. The first calculated value of the distance to the fault is compared with the assumed value of the distance to the fault. If the difference between the values is greater than a pre-set maximally permissible difference value, the assumed value of IBA is replaced. Thereafter a new calculation procedure is carried out according to above which provides new values. This iteration continues until the difference value of two consecutive calculation procedures is smaller than the set maximally permissible difference value, whereupon the last calculated values of the distance to fault is regarded as the real value.

Selection Between the Subroutines

A selection between the subprocedures is performed with the properly weighted function of the two quantities:

estimated fault resistances by the SUBPROCEDURE 1 and 2: $R_{F\_SUB1}$, $R_{F\_SUB2}$ estimated amplitudes of the healthy phases fault currents by the SUBPROCEDURE 1 and 2: $|I_{f\_healthy\_ph}|_{SUB1}$, $|I_{f\_healthy\_ph}|_{SUB2}$; for the considered cases: the average from the phases S, T amplitudes for the R-G faults and the phase T amplitude for the R-S-G faults are taken into consideration.

Figure 6:
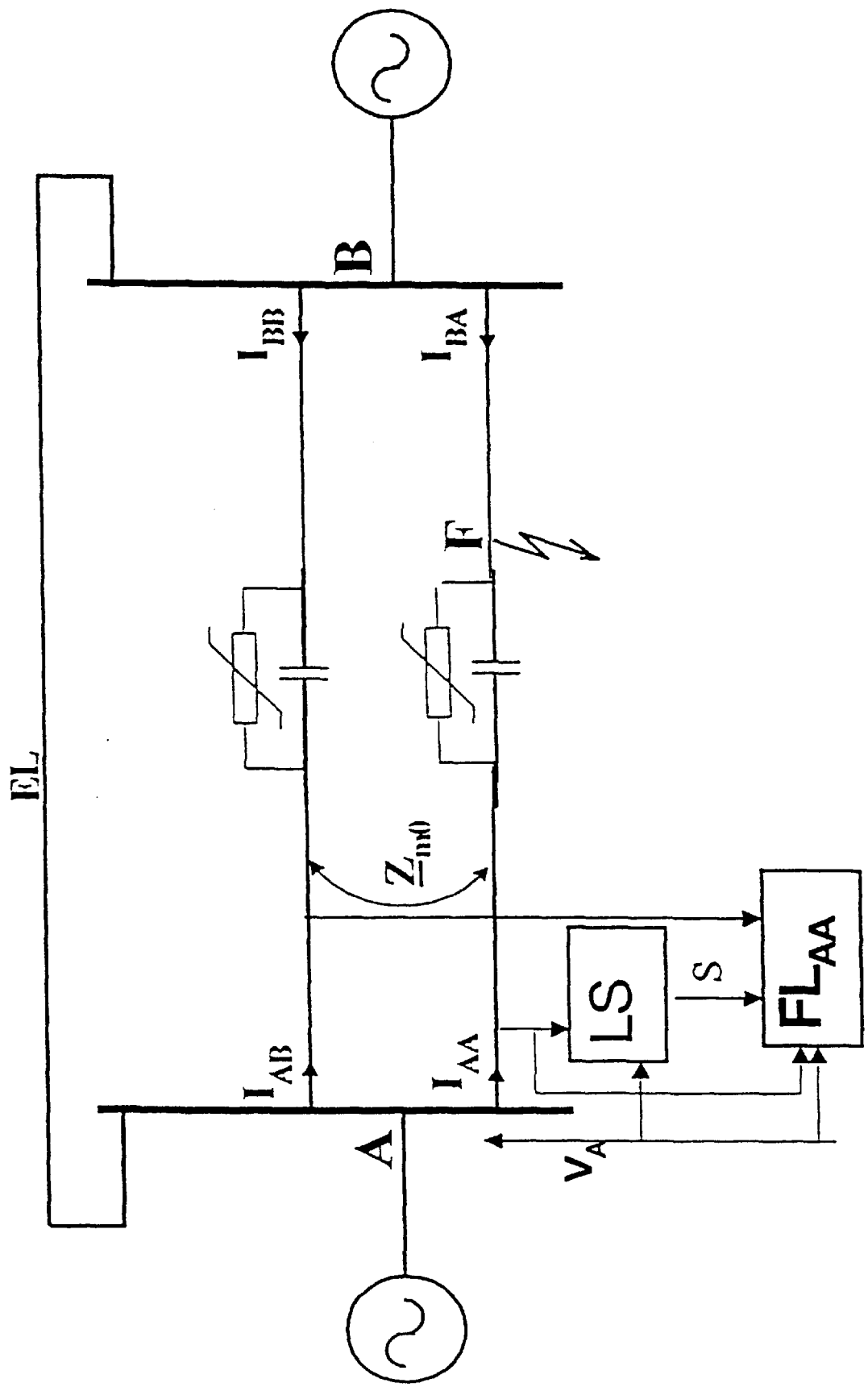
FIG. 6 shows one example of the connection of a fault locator according to the invention to an existing line protection device.

Lower value (if positive) of the estimated fault resistance and lower amplitude of the estimated fault path current support the selection of a particular subprocedure. A fault locator according to the present invention may be connected directly to the line section as shown in FIG. 1 or via a line protection device LS as shown in FIG. 6. The device and the fault locator are supplied with the measured values of the currents of the both lines IAA, IAB and voltages VA via voltage and current transformers (not shown). In the case of a fault appearing on line LA the line protecting device LS delivers a signal S to the fault locator. On the one hand this signal triggers the start of the calculation, by the fault locator, of the distance to the fault, and on the other hand the signal S contains information about the type of fault that has arisen. Where necessary the line protecting device may also provide a signal that trips a circuit breaker (not shown). If the fault locator is connected directly, it may be provided with its own triggering means.

Figure 7:
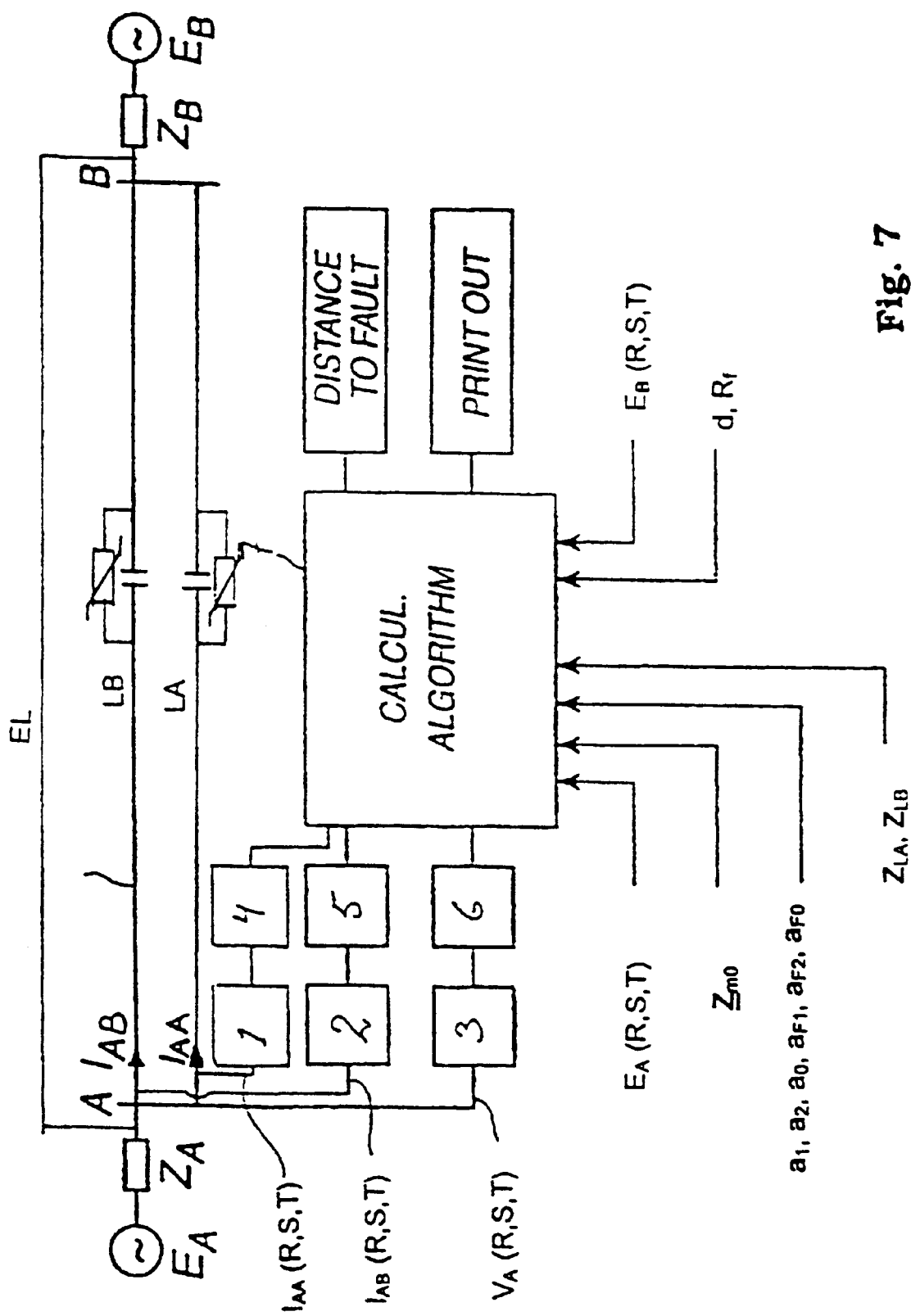
FIG. 7 shows an example of a device and system for carrying out the method.

FIG. 7 shows an embodiment of a device for determining the distance from a station, at one end of a transmission line, until the occurrence of a fault on the transmission line according to the described method, comprising certain measuring devices, measurement value converters, members for treatment of the calculating algorithms of the method, indicating means for the calculated distance to fault and a printer for printout of the calculated fault.

In the embodiment shown, measuring devices 1 to 3 for continuous measurement of all the phase currents for both the faulted line LA and healthy line LB and phase voltages are arranged in station A. In the measurement converters 4 to 6, a number of these consecutively measured values, which in case of a fault are passed to a calculating unit 7, are filtered and stored. The calculating unit is provided with the calculating algorithms described, programmed for the processes needed for calculating the distance to fault and the fault resistance. The calculating unit is also provided with known values such as the impedance of the lines. In connection with the occurrence of a fault, information regarding the type of fault may be supplied to the calculating unit for choosing the right coefficients. When the calculating unit has determined the distance to fault, it is displayed on the device and/or sent to remotely located display means. A printout of the result may also be provided. In addition to signalling the fault distance, the device can produce reports in which are recorded measured values of the currents of both lines, voltages, type of fault and other parameters associated with a given fault at a distance.

The calculating unit may comprise filters for filtering the signals, A/D-converters for converting and sampling the signals and one or more micro processors. The micro processor (or processors) comprises a central processing unit CPU performing the following functions: collection of measured values, processing of measured values, calculation of distance to fault and output of result from calculation. The micro processor (or processors) further comprises a data memory and a program memory.

A computer program for carrying out the method according to the present invention is stored in the program memory. It is to be understood that the computer program may also be run on a general purpose computer instead of a specially adapted computer.

The software includes computer program code elements or software code portions that make the computer perform the said method using the equations, algorithms, data and calculations previously described. A part of the program may be stored in a processor as above, but also in a RAM, ROM, PROM or EPROM chip or a similar memory. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

Equivalents

It is to be understood that the embodiments described above and shown on the drawings are to be regarded as non-limiting examples of the present invention. Although preferred embodiments of the present invention have been illustrated in the accompanying drawings and described in the foregoing detailed description, it will be understood that the invention is capable of numerous rearrangements, modifications, equivalents and substitutions without departing from the scope of the invention as set forth in the appended claims.

What is claimed is:

1. A method of automatically locating a fault (F) in a section of parallel A.C. transmission lines in a network comprising the steps of:

measuring currents and voltages of both lines at a measuring point arranged at one end (A) of the section, determining a fault distance (x) between the measuring point and the fault as a solution of an equation comprising the fault distance (x) as a variable and the fault resistance ($R_f$), wherein the equation is:

$$Ax^2 - Bx + C - R_f = 0$$

wherein parameters A, B, C, D comprise phase components of the locally measured currents and voltages and are obtained from calculating from the measuring point to the fault location along the both parallel lines, and wherein the equation is resolved into its real and imaginary parts:

$$\text{Real}(A)x^2 - \text{Real}(B)x + \text{Real}(C) - R_f = 0$$

$$\text{Imag}(A)x^2 - \text{Imag}(B)x + \text{Imag}(C) = 0,$$

whereby the fault distance is derived from the imaginary part, as $$x = x_a, \text{ if Imag}(A) > 0,$$

$$x = x_b, \text{ if Imag}(A) < 0,$$

and wherein:

$$x_a = \frac{\text{Imag}(B) - \sqrt{\Delta}}{2\text{Imag}(A)}$$

$$x_b = \frac{\text{Imag}(B) + \sqrt{\Delta}}{2\text{Imag}(A)}, \text{ and}$$

$$\Delta = [\text{Imag}(B)]^2 - 4\text{Imag}(A)\text{Imag}(C).$$

2. The method according to claim 1, wherein the parameters characterize a particular type of fault.

3. The method according to claim 2, comprising determining a fault type matrix Kf for the particular type of fault by using a 3-phase general fault model.

4. The method according to claim 3, further comprising:

using a matrix notation of said section taking into account mutual impedances between the lines;

including the fault type matrix;

obtaining a matrx formula $$A_c x^2 - B_c x + C_c - D_c = 0,$$

wherein $A_c$, $B_c$, $C_c$, $D_c$ are 3*1 vectors; and multiplying both sides of the matrix formula with vector $$P = \frac{D}{D^T D},$$

wherein $D^T$ is matrix transposed with respect to matrix D, $$A_c = (Z_m - Z_{LA}) K_f (Z_{LA} I_{AA} + Z_m I_{AB}),$$

$$C_c = (Z_m - Z_{LA}) K_f (V_A - Z_v(|I_{AA}|) I_{AA}),$$

$$B_c = A_c + C_c,$$

$$D = (Z_m - Z_{LA} - Z_v(|I_{AA}|)) I_{AA} - (Z_m - Z_{LB} - Z_v(|I_{AB}|)) I_{AB},$$

and $$D_c = D R_f$$

5. The method according to claim 2, wherein the fault type matrix Kf is expressed as $$K_f = \begin{bmatrix} k_{RR} & k_{RS} & k_{RT} \\ k_{RS} & k_{SS} & k_{ST} \\ k_{RT} & k_{ST} & k_{TT} \end{bmatrix}.$$

6. The method according to claim 1, comprising series compensating the parallel transmission lines and representing the compensation in the calculating paths as equivalent resistance and reactance.

7. The method according to claim 6, wherein parallel connection of a series capacitor and a varistor constitutes a non-linear impedance (ZV) the non-linear impedance (ZV) being represented by the equivalent resistance and reactance (RV and XV), the equivalent resistance and reactance (RV and XV) being determined as a function of a traversing current of each phase, the method comprising determining an actual value of the resistance and reactance with the actual currents, the actual currents, after the occurrence of the fault, flowing through the impedance, whereby said non-linear impedance may be set in a matrix form.

8. The method according to claim 6, comprising solving the equation for two cases:

(1) when the fault is assumed behind the series compensation of the faulted line and (2) when the fault is assumed in front of the series compensation of the faulted line, as seen from the measuring point.

9. The method according to claim 6, comprising determining a matrix of equivalent parameters for the series capacitors and metal oxide varistors of the faulted line in order to obtain the fundamental frequency equivalent.

10. The method according to claim 9, comprising calculating the fault resistance $R_f$ from the real part of the equation and including the matrix of the fundamental frequency.

11. The method according to claim 10, wherein the matrix of the fundamental frequency is expressed as $$Z_v(|I_{AA}|) = \begin{bmatrix} Z_v(|I_{AA\_R}|) & 0 & 0 \\ 0 & Z_v(|I_{AA\_S}|) & 0 \\ 0 & 0 & Z_v(|I_{AA\_T}|) \end{bmatrix}$$

for case (1), and $$Z_v(|I_{BA}|) = \begin{bmatrix} Z_v(|I_{BA\_R}|) & 0 & 0 \\ 0 & Z_v(|I_{BA\_S}|) & 0 \\ 0 & 0 & Z_v(|I_{BA\_T}|) \end{bmatrix}$$

for case (2).

12. The method according to claim 10, comprising selecting a lower calculated fault distance from said two cases, based on:
 estimated fault resistance of the two cases; and
 estimated amplitudes of healthy phases fault current; and
wherein lower estimated values support the calculated fault distance of a case.

13. The method according to claim 12, wherein the amplitudes of the phase currents for case (2) are obtained by iterative calculation.

14. A device for locating a fault (F) in a section of parallel transmission lines comprising: calculating member arranged to automatically calculate, on the basis of current and voltage values measured adjacent to one end of said section and a known impedance of the lines, a distance between a measuring point and the fault; and
 wherein the calculating members are arranged to determine, on the basis of information about the type of fault in question and complex quantities of the measured values and using a network model, the fault distance as the solution of an equation $Ax^2-Bx+C-R_f=0$;
 wherein x is a variable fault distance and $R_f$ is the measured fault resistance;
 wherein the parameters (A, B, C, D) comprise the phase components of locally measured currents and voltages and are obtained from calculating from a measuring point to the fault location along the both parallel lines;
 wherein the equation is resolved into its real and imaginary parts:

$$\text{Real}(A)x^2-\text{Real}(B)x+\text{Real}(C)-R_f=0$$

and $$\text{Imag}(A)x^2-\text{Imag}(B)x+\text{Imag}(C)=0;$$

wherein the fault distance is derived from the imaginary part, as $x=x_a$, if $\text{Imag}(A)>0$, and $x=x_b$, if $\text{Imag}(A)<0$, wherein $$x_a = \frac{\text{Imag}(B) - \sqrt{D}}{2\text{Imag}(A)},$$

$$x_b = \frac{\text{Imag}(B) + \sqrt{D}}{2\text{Imag}(A)}, \text{ and}$$

$$\Delta = [\text{Imag}(B)]^2 - 4\text{Imag}(A)\text{Imag}(C).$$

15. Use of a device according to claim 14 to determine the distance to fault in a parallel transmission line.

16. Use of a device according to claim 14 to record and signal currents and voltages associated with a fault at a distance (d) from a measuring station (A).

17. A computer program product selectively comprising computer code means and software code portions for automatically locating a fault (F) in a section of parallel A.C. transmission lines by making a computer or processor perform the steps of:
 receiving values of currents and voltages of both the lines at a measuring point arranged at one end (A) of the section;
 calculating a fault distance x from the measuring point to the fault location along the both parallel lines as a solution of an equation $Ax^2-Bx+C-Rf=0$;
 wherein the fault distance x is a variable and the fault resistance ($R_f$) and parameters A, B, C, D depend on phase components of the locally measured currents and voltages;
 wherein the equation is resolved for the real parts and the imaginary parts respectively; and
 reporting the fault distance x.

18. A computer program product according to claim 17 contained on/in a computer readable medium.

* * * * *